US008217681B2

(12) United States Patent
Avian

(10) Patent No.: US 8,217,681 B2
(45) Date of Patent: Jul. 10, 2012

(54) CONFIGURABLE INPUT PORT OF AN ELECTRONIC COMPUTER OF A MOTOR VEHICLE

(75) Inventor: Philippe Avian, Goyrans (FR)

(73) Assignee: Continental Automotive France, Toulouse (FR)

( * ) Notice: Subject to any disclaimer, the term of this patent is extended or adjusted under 35 U.S.C. 154(b) by 168 days.

(21) Appl. No.: 12/761,763

(22) Filed: Apr. 16, 2010

(65) Prior Publication Data

US 2010/0283506 A1      Nov. 11, 2010

(30) Foreign Application Priority Data

May 7, 2009  (FR) ...................................... 09 02196

(51) Int. Cl.
*H03K 17/16* (2006.01)
(52) U.S. Cl. ............. 326/86; 326/30; 327/108; 327/307
(58) Field of Classification Search ............ 326/30, 326/21, 83, 86, 87; 327/307–112
See application file for complete search history.

(56) References Cited

U.S. PATENT DOCUMENTS

| | | | | |
|---|---|---|---|---|
| 6,133,749 | A * | 10/2000 | Hansen et al. ................. | 326/30 |
| 6,236,238 | B1 | 5/2001 | Tanji et al. | |
| 7,106,095 | B2 * | 9/2006 | Kim et al. ....................... | 326/30 |
| 7,116,129 | B2 * | 10/2006 | Pan et al. ......................... | 326/32 |
| 7,123,055 | B1 * | 10/2006 | Chong et al. .................... | 326/87 |
| 7,295,033 | B2 * | 11/2007 | Chung et al. .................... | 326/30 |
| 2007/0152704 | A1 * | 7/2007 | Park ................................. | 326/30 |
| 2007/0296470 | A1 | 12/2007 | Hayashi et al. | |

OTHER PUBLICATIONS

French Search Report dated Dec. 4, 2009, from corresponding French application.

* cited by examiner

*Primary Examiner* — Vibol Tan
(74) *Attorney, Agent, or Firm* — Young & Thompson

(57) ABSTRACT

An input port (2) of an electronic computer (4) of a motor vehicle includes: i) a plurality of pull-up loads (230a), each pull-up load being coupled to a power supply line (21) and to an input line (20) and including at least one transistor (231a) forming a current mirror with a first current reference module (232a), and ii) a plurality of pull-down loads (230b), each pull-down load being coupled to a ground line (22) and to the input line (20) and including at least one transistor (231b) forming a current mirror with a second current reference module (232b). Each pull-up load and each pull-down load includes a switch (233a, 233b) and the input port is configurable by ordering the closure or opening of each switch. An input circuit (3) including at least one input port and an electronic computer of a motor vehicle including the input circuit are described.

12 Claims, 4 Drawing Sheets

CONFIGURABLE INPUT PORT OF AN ELECTRONIC COMPUTER OF A MOTOR VEHICLE

Figure 1A:
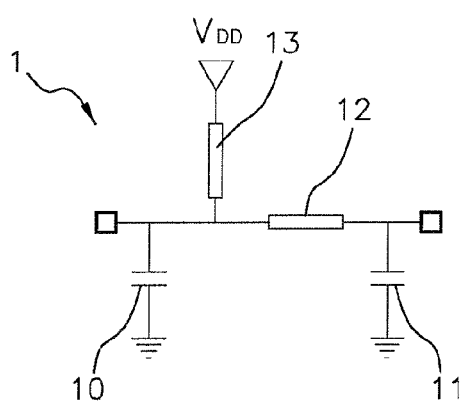
Figure 1C:
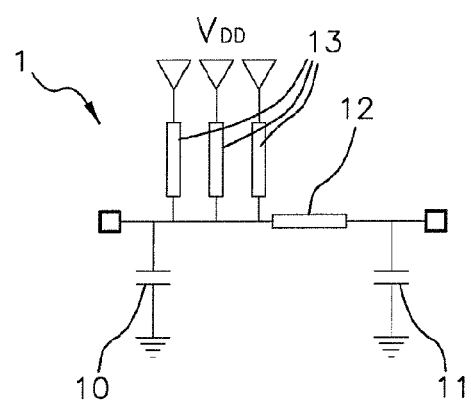
Figure 1B:
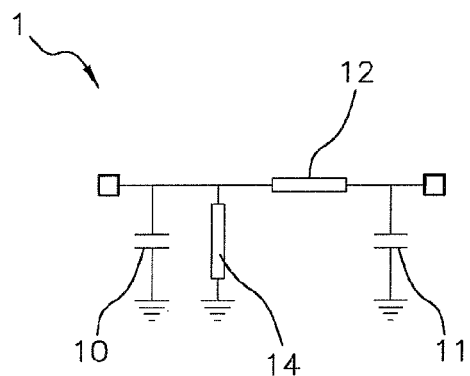
Figure 1D:
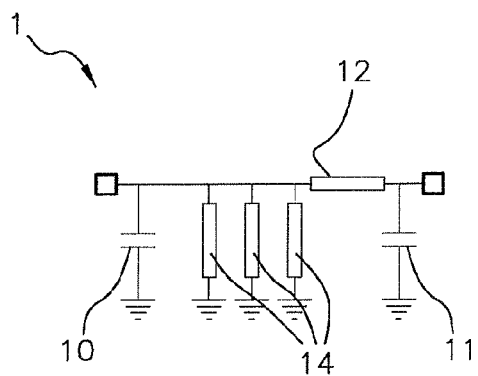

The present invention belongs to the field of electronic computers for motor vehicles, and more particularly relates to an electronic computer comprising an input circuit with one or more configurable input ports.

Motor vehicle computers, as is known, comprise a microcontroller, to which peripheral devices are connected via input ports and output ports. In the case of an engine computer, the microcontroller controls the operation of the engine of said vehicle, and the peripheral devices are, for example, sensors implemented to monitor the operation of said engine.

These days, more and more sensors have to be connected and more often than not they have characteristics (dynamic range of the signals supplied, output impedance, etc.) that are different, because of a different calibration and/or because they are sensors of different types, and it is necessary to design specific input ports for each sensor that has to be connected.

FIGS. 1a, 1b, 1c and 1d show examples of input ports of engine computers according to the state of the art.

Generally, an input port 1 according to the state of the art comprises, more often than not, at the input on the left of each FIG. 1a to 1d, a first capacitor 10 protecting against electrostatic discharges, and a low-pass filter, at the output on the right of each FIG. 1a to 1d, generally comprising a second capacitor 11 and a resistor 12.

Depending on the type of sensor envisaged, such an input port 1 also comprises one or more pull-up resistors 13 that connect the input port 1 to a power supply line, or one or more pull-down resistors 14 that connect said input port to a ground line. Such pull-up 13 or pull-down 14 resistors are used, for example, to polarize the sensor or to supply a default voltage to the input of the microcontroller in the event of failure of the sensor (adjacent to a voltage $V_{DD}$ generally close to 5 volts (V) in the case of a pull-up resistor 13, and adjacent to a voltage that is generally substantially nil in the case of a pull-down resistor 14).

The number of these resistors, and their values, depend on the type of sensor to which the input port 1 is to be connected. Since each input port 1 is specifically designed for the sensor to which it has to be connected, it will be understood that the input ports are not interchangeable, and replacing one sensor with another sensor of different characteristics on the same input port is not possible.

This solution allows no flexibility, flexibility that would, however, be advantageous for adaptation to new sensor configurations (new vehicle models, new standards to be observed, etc.).

These days, motor vehicle computers generally have free input ports that can be used subsequently to connect other sensors. To obtain real flexibility, it is, however, necessary to add a large number of such free input ports.

One aim of the invention is to provide an electronic motor vehicle computer comprising input ports that can be reconfigured to connect different peripheral devices, preferably with no hardware modification to the computer but by modifying the software run by the microcontroller of said computer.

Another aim of the invention is to provide such input ports that are also easy to incorporate in one and the same custom integrated circuit of ASIC (application-specific integrated circuit) type.

The present invention proposes to resolve the above-mentioned problems by means of an input port of an electronic computer of a motor vehicle, comprising an input line designed to be coupled to a peripheral device of the computer. According to the invention, the input port comprises:

a plurality of pull-up loads, each pull-up load being coupled to a power supply line and to the input line and comprising at least one transistor forming a current mirror with a first current reference module, a plurality of pull-down loads, each pull-down load being coupled to a ground line and to the input line and comprising at least one transistor forming a current mirror with a second current reference module.

Each pull-up load and each pull-down load comprises a switch, the closure of which individually activates the associated pull-up or pull-down load, and the input port is configurable by ordering the closure or opening of each switch.

Preferably, the pull-up loads and the pull-down loads do not all comprise the same number of transistors.

Preferably, the pull-up load of index n, $1 \leq n \leq N$, N being the number of pull-up loads, comprises a number of transistors proportional to $2n-1$, and the pull-down load of index m, $1 \leq m \leq M$, M being the number of pull-down loads, comprises a number of transistors proportional to $2m-1$.

Advantageously, all the transistors of the N pull-up loads are coupled to the same first current reference module, and all the transistors of the M pull-down loads are coupled to the same second current reference module.

The present invention also relates to an input circuit of an electronic computer of a motor vehicle comprising at least one input port according to the invention, and also comprising a first reference current source coupled to the first current reference module of the at least one input port, a second reference current source coupled to the second current reference module of the at least one input port, and configuration means for the at least one input port.

Preferably, the first reference current source and the second reference current source are one and the same reference current source, designed to power both the first current reference module and the second current reference module.

Preferably, the input circuit comprises a plurality of input ports, and the same reference current source is designed to supply a reference current to each input port.

Preferably, the input circuit comprises a reference voltage source designed to supply the reference current source with a reference voltage of adjustable value, according to which the intensity of the reference current is controlled.

The present invention also relates to an electronic computer of a motor vehicle comprising at least one microcontroller coupled to an input circuit according to the invention. Preferably, the electronic computer comprises a non-volatile electronic memory in which are stored instruction codes intended to be executed by the microcontroller to configure or reconfigure the input ports of the input circuit.

Figure 2:
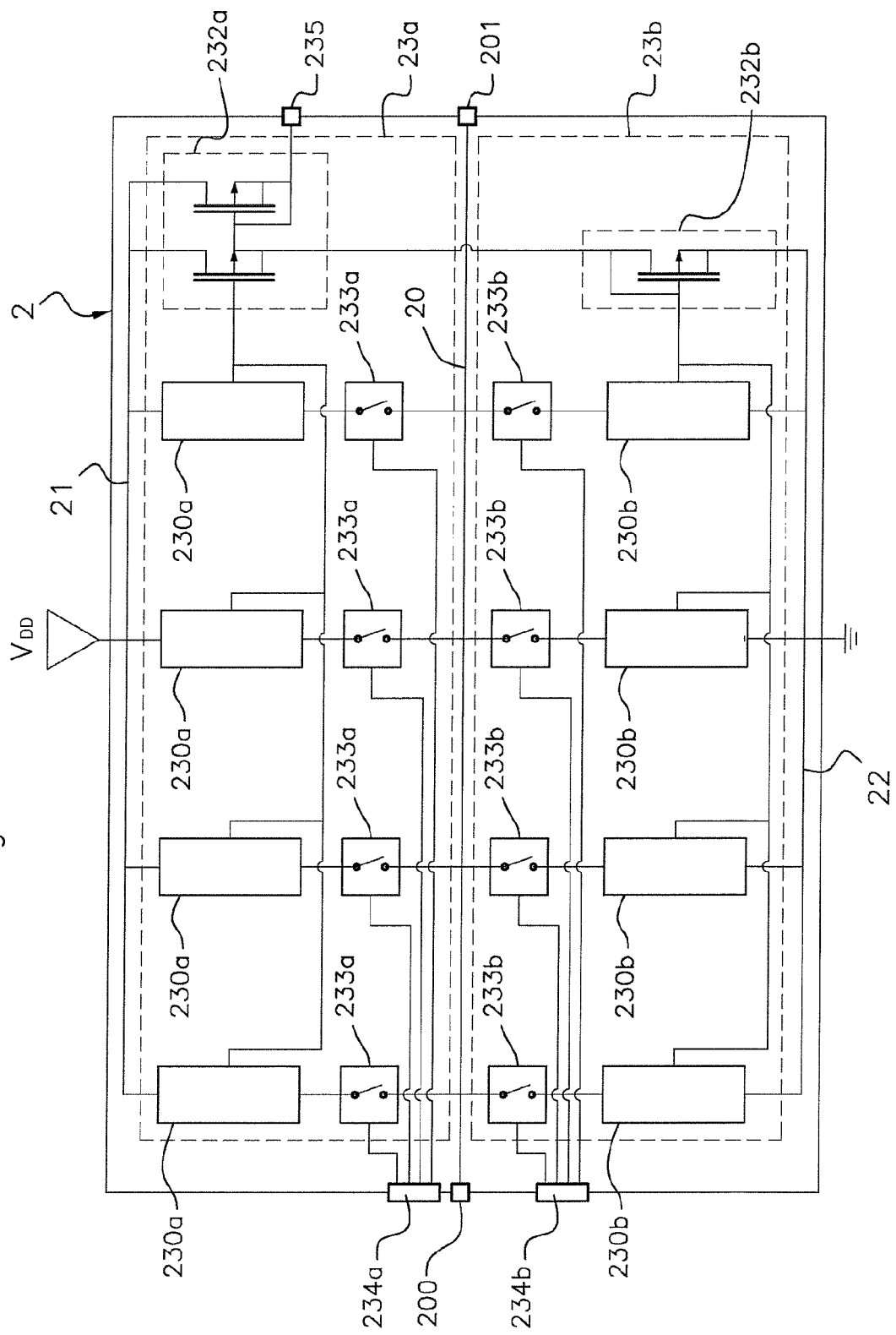
Figure 3:
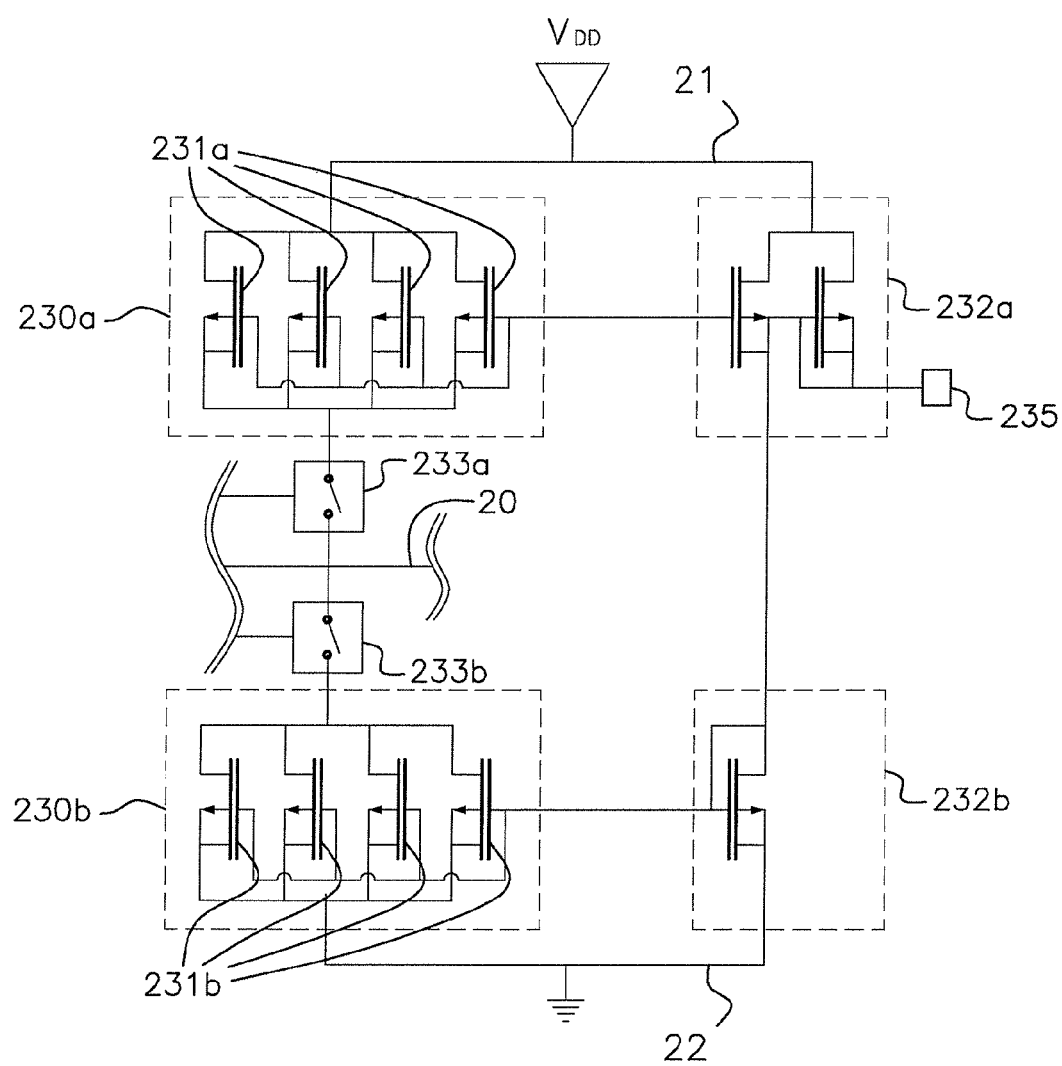
Figure 4:
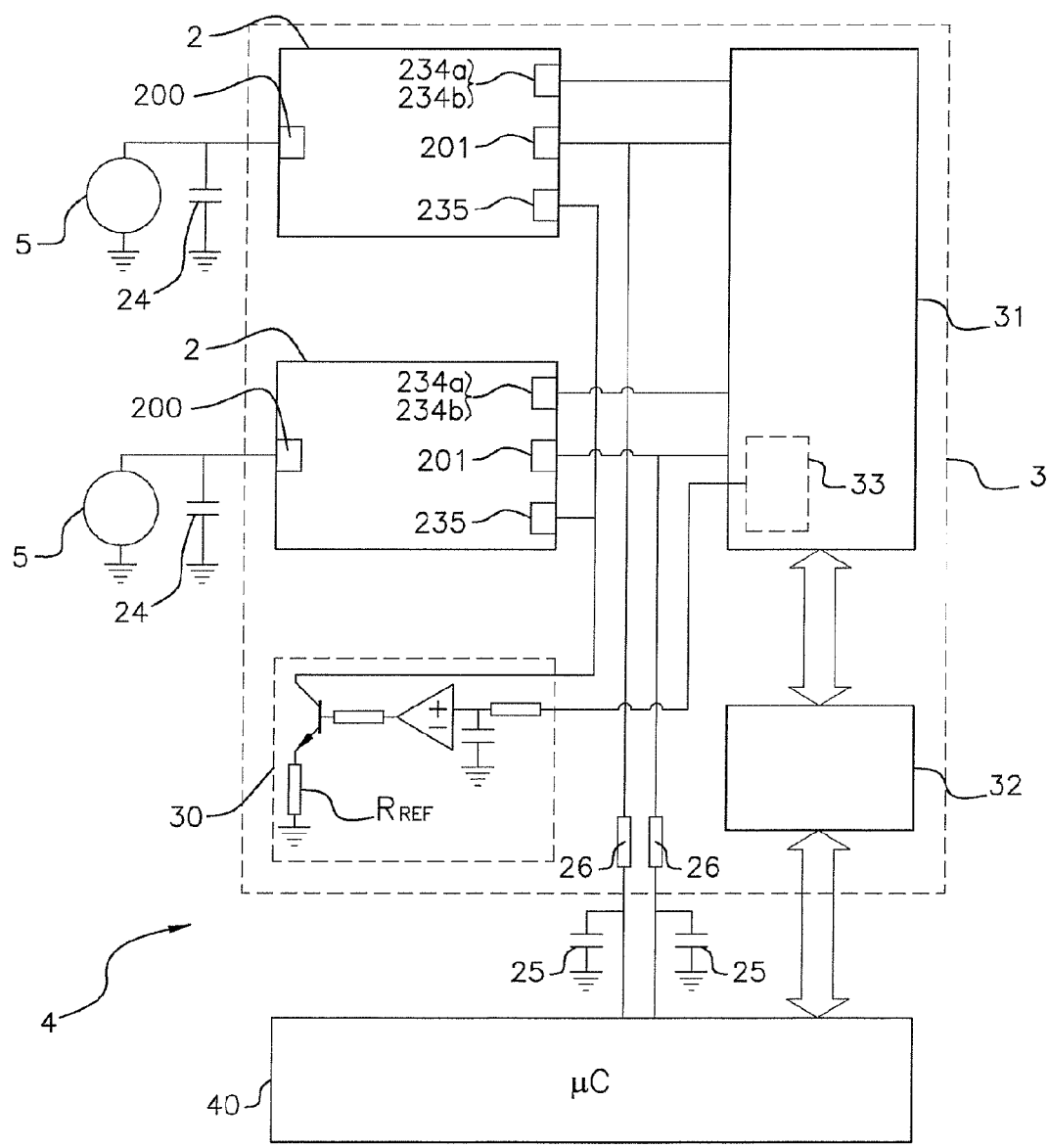

The following description of embodiments of the invention is given with reference to the figures, which represent in a nonlimiting way:

FIGS. 1a, 1b, 1c and 1d: already described, schematic diagrams of exemplary input ports according to the state of the art, FIG. 2: a schematic diagram of an input port of an electronic computer of a motor vehicle according to the invention, FIG. 3: a schematic diagram of pull loads of an input port according to the invention, FIG. 4: a schematic diagram of an electronic computer of a motor vehicle according to the invention.

For the purposes of the description, the nonlimiting case of a motor vehicle engine computer will be considered, the computer being used to control the operations of a motor vehicle engine. This choice is not limiting of the invention, which can be applied to any type of motor vehicle electronic computer, such as a passenger compartment computer (Body Module Computer), an ABS computer, etc.

The present invention first of all relates to an input port 2 of an electronic computer of a motor vehicle.

FIG. 2 represents an exemplary input port 2 according to the invention. Such an input port 2 comprises an input line 20, comprising an input contact 200 intended to be coupled to a peripheral device 5 of an electronic computer 4, and an output contact 201 intended to be coupled to a microcontroller 40 of said computer, which can be seen in FIG. 4.

The expression "coupled to" should be understood to mean an electrical connection that is either direct via a conductive line, or indirect via other components such as a resistor, a switch, etc. In the case of an indirect connection via a switch, it will also be understood that the electrical connection is not permanent depending on whether the switch is closed or open.

FIG. 4, which will be described later, represents an exemplary electronic computer 4 comprising a plurality of input ports 2 according to the invention, via which peripheral devices 5 are connected to said computer, peripheral devices that can, in the case of an engine computer, be sensors implemented to monitor the operation of the engine (temperature, pressure, speed, and other sensors).

The input port 2 comprises a first stage, called "current injection stage" 23a, represented in a top portion of FIG. 2, and a second stage, called "current absorption stage" 23b, represented in a bottom portion of FIG. 2.

The current injection 23a and current absorption 23b stages each comprise a plurality of pull loads, respectively 230a, 230b, each of said pull loads being associated with a current reference module 232a, 232b.

In the electronic computer 4, each current reference module 232a, 232b is coupled to a reference current source 30 via an electrical contact 235. Preferably, the same reference current source 30 is implemented both for the current injection stage 23a and the current absorption stage 23b, as represented in FIG. 4. According to other embodiments, two reference current sources are implemented: a reference injection current source for the current injection stage 23a and a reference absorption current source for the current absorption stage 23b.

In the case of the current injection stage 23a, each of the pull loads 230a is a pull-up load, coupled both to the input line 20 and to a power supply line 21.

In the case of the current absorption stage 23b, each of the pull loads 230b is a pull-down load, coupled both to the input line 20 and to a ground line 22.

In the electronic computer 4, when powered up, a voltage $V_{DD}$, which is, for example, adjacent to 5 V, is measured between the power supply line 21 and the ground line 22.

Preferably, the current injection 23a and current absorption 23b stages each comprise a single current reference module 232a, 232b, which is shared by all the pull loads respectively 230a, 230b of the corresponding stage, as represented in FIG. 2.

FIG. 3 partially represents the current injection stage 23a and the current absorption stage 23b, detailing a nonlimiting exemplary embodiment of a pull-up load 230a and of a pull-down load 230b.

Each pull load 230a, 230b generally comprises at least one transistor, respectively 231a, 231b, which, with the associated current reference module 232a, 232b, forms a current mirror type circuit.

In the example represented in FIG. 3, the pull-up load 230a comprises four transistors 231a in parallel between the power supply line 21 and the input line 20, and each pull-down load 230b comprises four transistors 231b in parallel between the ground line 22 and the input line 20.

In the nonlimiting example represented, the transistors 231a, 231b are of MOS type. The gates of the transistors 231a of the current injection stage 23a are coupled to the current reference module 232a, in particular to a gate of a transistor of said current reference module, and the gates of the transistors 231b of the current absorption stage 23b are coupled to a gate of a transistor of the current reference module 232b.

Each pull load 230a of the current injection stage 23a is mounted in series with a switch 233a, and each pull load 230b of the current absorption stage 23b is mounted in series with a switch 233b. Each switch 233a, 233b is preferably also implemented by means of a transistor, the closure and opening of which are controlled by the electronic computer 4, via a control contact 234a, 234b.

When a switch 233a, 233b is closed, the associated pull load 230a, 230b is electrically connected to the input line 20. If the voltage $V_{DD}$ is not nil, each transistor 231a, 231b of said pull load is passed through by a current, the intensity of which depends on that of a current passing through the associated current reference module 232a, 232b, because the transistor 231a, 231b and said associated current reference module form a current mirror type circuit.

The intensity of the current passing through each current reference module 232a, 232b depends on that which is supplied by the reference current source 30, represented in FIG. 4.

As is known to those skilled in the art, when the current reference module 232a, 232b comprises transistors with characteristics (semiconductor material, doping, dimensions, etc.) that are substantially equal to those of the transistor 231a, 231b with which it is associated, the intensity of the current passing through said transistor and the intensity of the current passing through said current reference module are substantially equal.

Such current mirror type circuits are known to those skilled in the art, and the invention is not limited to the examples represented in FIGS. 2 and 3, but extends to all circuits within the scope of those skilled in the art used to control the intensity of the current in each transistor 231a, 231b.

It will therefore be understood that, by individually controlling each pull-up load 230a (closing or opening the associated switch 233a) and each pull-down load 230b (closing or opening the associated switch 233b), it will be possible to control the intensity:

of the current passing through the current injection stage 23a, called "injection current", equal to the sum of the currents passing through the activated pull loads 230a, of the current passing through the current absorption stage 23b, called "absorption current", equal to the sum of the currents passing through the activated pull loads 230b.

By controlling both the intensity of the injection current and the intensity of the absorption current, the input port 2 according to the invention is equivalent to an input port comprising a variable pull-up resistor and a variable pull-down resistor. The input port 2 according to the invention is said to be "configurable" because, by individually controlling each switch 233a, 233b, it is possible to adapt the input port 2 to the characteristics of the peripheral device 5 to which it will be connected.

Preferably, the transistors 231a, 231b of one and the same pull load 230a, 230b all have substantially the same characteristics so that they are all passed through by the same current, called "elementary current" (injection or absorption), when the associated switch 233a, 233b is closed.

In a nonlimiting way, hereinafter in the explanation, it will be considered that the transistors 231a of the current injection stage 23a on the one hand, and the transistors 231b of the current absorption stage 23b on the other hand, all have substantially the same characteristics, that is to say that the transistors of one and the same stage are all passed through by the same elementary current when the associated switch 233a, 233b is closed.

In a preferred embodiment, the pull loads 230a of the current injection stage 23a on the one hand, and the pull loads 230b of the current absorption stage 23b on the other hand, do not all have the same number of transistors 231a, 231b, so that the currents passing through two different pull loads 230a, 230b of one and the same stage have different intensities (a current passing through a pull load 230a, 230b corresponding to the sum of the elementary currents passing through the transistors 231a, 231b of which it is composed).

In a particular embodiment, the pull loads 230a of the current injection stage 23a on the one hand, and the pull loads 230b of the current absorption stage 23b on the other hand, also comprise a number of transistors 231a, 231b proportional to a power of two.

In the case where the current injection stage 23a comprises N pull loads 230a, the pull load 230a of index n ($1 \leq n \leq N$) comprises $K \cdot 2^{n-1}$ transistors 231a, in which K is a positive integer number, preferably equal to one.

Similarly, in the case where the current absorption stage 23b comprises M pull loads 230b (M possibly being different from N), the pull load 230b of index m ($1 \leq m \leq M$) comprises $L \cdot 2^{m-1}$ transistors 231b, where L is a positive integer number, preferably equal to one.

For example, if N is equal to four and K is equal to one, the four pull loads 230a of the current injection stage 23a respectively comprise one, two, four and eight transistors 231a. If the elementary current has an intensity equal to 10 microamperes (μA), the four pull loads 230a are passed through by currents of intensities respectively adjacent to 10 μA, 20 μA, 40 μA and 80 μA.

By combining different pull-up loads 230a, which can be individually activated by closing the associated switches 233a, it is possible to obtain an injection current that can take all the values from 10 μA to 150 μA, in steps of 10 μA.

It will be understood that this embodiment is particularly advantageous, because a large number of different intensity values is obtained with a small number of components, since fifteen transistors 231a are necessary with just four switches 233a. This mode also offers the advantage of requiring only four signals to control the switches 233a.

The same advantages are obtained in a similar way for the current absorption stage 23b.

Generally, the current injection 23a and current absorption 23b) stages can be designed so that the injection and absorption currents fall within different intensity bands.

Injection and absorption currents of different intensities are preferably obtained from elementary injection currents (passing through each of the transistors 231a of the current injection stage 23a) and absorption currents (passing through each of the transistors 231b of the current absorption stage 23b) of different intensities. Elementary injection and absorption currents of different intensities are, for example, obtained by considering current reference modules 232a, 232b of different characteristics, or transistors 231a, 231b of different characteristics, and so on.

According to other embodiments, different injection and absorption currents are obtained by assuming different numbers of transistors 231a, 231b for each pull load 230a, 230b between the current injection stage 23a and the current absorption stage 23b. For example, assuming elementary injection and absorption currents of intensity equal to 10 μA, and assuming K to be equal to one and L equal to 10, the injection current can take all the values from 10 μA to 150 μA, in steps of 10 μA, whereas the absorption current can take all the values from 100 μA to 1.5 mA, in steps of 100 μA, in the case where N and M are equal to four.

One advantage of the invention lies in the fact that the input port 2 according to the invention mainly comprises transistors (in addition, the transistors 231a, 231b, the current reference modules 232a, 232b and the switches 233a, 233b preferably mainly comprise transistors), and can be easily incorporated in one and the same custom integrated circuit of ASIC type, by implementing methods known to those skilled in the art.

The input port 2 according to the invention preferably comprises a first capacitor 24 at the input, and a low-pass filter at the output mainly comprising a second capacitor 25 and a resistor 26. These components can be seen in FIG. 4 and their values are determined by implementing methods known to those skilled in the art. Each of these components can be incorporated in the integrated circuit of the input port 2, or can be implemented as discrete components external to said integrated circuit, a person skilled in the art being able to choose to incorporate or not incorporate each of said components according to their values.

An input circuit 3 according to the invention comprises at least one input port 2 as described, a reference current source for the current injection stage 23a, a reference current source for the current absorption stage 23b and configuration means for each input port 2.

In the example represented in FIG. 4, the input circuit 3 comprises a plurality of input ports 2.

As represented in FIG. 4, the reference current source of the current injection stage 23a and the reference current source of the current absorption stage 23b of one and the same input port 2 are preferably combined, that is to say that one and the same reference current source 30 powers said current injection and absorption stages, via the electrical contact 235.

In the case where the input circuit 3 comprises a plurality of input ports 2, preferably the same reference current source 30 powers all the input ports, as represented in FIG. 4. Preferably, the reference current source 30 comprises a current amplifier circuit, of a known type, comprising an operational amplifier, and a reference resistor $R_{REF}$, the value of which is known, the current passing through the resistor $R_{REF}$ being amplified by the current amplifier circuit and being supplied to the input ports 2.

In a preferred embodiment, the configuration means comprise a logic unit 31 coupled to the different switches 233a, 233b of the input ports 2 via the control contacts 234a, 234b, and a serial/parallel interface 32 (or SPI) coupled to the microcontroller 40 of the electronic computer 4.

According to the signals received on the SPI interface 32, the logic unit 31 configures the pull loads 230a, 230b of the input ports 2, by closing or by opening the various switches 233a, 233b.

Preferably, the logic unit 31 also comprises comparators, known per se and not represented in FIG. 4, which are coupled to the output contacts 201 of the input ports 2. Thus, after having configured the various input ports 2, it is possible to check the configuration of the current injection 23a and current absorption 23b stages, by comparing the voltage on the output contacts 201 to the expected voltage.

In a particular embodiment, the logic unit 31 also comprises a reference voltage source 33, designed to supply a reference voltage whose value can be adjusted. This reference voltage is supplied to the reference current source 30, that is to say, to the current amplifier circuit, to adjust in a known manner the intensity of the current passing through the resistor $R_{REF}$, and therefore to adjust according to the invention the intensities of the elementary currents of the input ports 2.

Preferably, the adjustable reference voltage source 33 is a modulated signal generator with pulse width modulation (PWM), followed by a low-pass filter, for which it is known that, by modifying the width of the pulses (or "duty cycle") of the PWM signal, the value of the voltage obtained after filtering is also modified.

By measuring the voltage on an output contact 201 of an input port 2 and by comparing it to an expected voltage for the peripheral device concerned, it is possible to determine whether the intensity of the reference current should be increased or reduced by modifying the duty cycle of the PWM signal. When the voltage measured on the output port 201 is sufficiently close to the expected voltage, according to the desired precision, the duty cycle is preferably stored in a non-volatile memory (ROM, EEPROM, flash memory, etc.) of the electronic computer 4, in order to configure the reference voltage source 33 with the same duty cycle each time said computer is started up.

The electronic computer 4 according to the invention comprises at least one input circuit 3 as described, coupled to the microcontroller 40 of known type via the output contacts 201 of the input ports 2, and via the configuration means (for example via the SPI interface 32).

It will be understood that the electronic computer 4 according to the invention, because it comprises configurable input ports 2, can consequently be used for different configurations of peripheral devices 5.

The configuring of each input port 2 is done simply by closing/opening the switches 233a, 233b, without needing to modify the hardware of the electronic computer 4. Preferably, the input port 2 is configured by the microcontroller 40 which executes instruction codes stored in the non-volatile electronic memory of the electronic computer 4, and said input port is reconfigured by executing different instruction codes, which are located in a different memory area of the non-volatile memory, or in the same memory area whose content has in the meantime been modified.

According to other embodiments, the electronic computer 4 also comprises one or more non-configurable input ports, conforming in number and in specifications to the state of the art, which can prove advantageous in the case where it would be more complicated and/or economically less advantageous to produce them in a configurable form.

The electronic computer 4 according to the invention is therefore flexible and can be used with different configurations of peripheral devices 5 without a need to physically modify said computer, it being sufficient to update the instruction codes executed by the microcontroller 40. Moreover, another advantage of the invention is a greater capacity for integration. In practice, each input port 2 according to the invention, and each input circuit 3 according to the invention mainly comprises transistors which can easily be integrated on one and the same semiconductor material substrate.

The invention claimed is:

1. An input circuit (3) of an electronic computer (4) of a motor vehicle comprising at least one input port (2) comprising an input line (20) designed to be coupled to a peripheral device (5) of said electronic computer:
    a plurality of pull-up loads (230a), each pull-up load being coupled to a power supply line (21) and to the input line (20) and comprising at least one transistor (231a) forming a current mirror with a first current reference module (232a),
    a plurality of pull-down loads (230b), each pull-down load being coupled to a ground line (22) and to the input line (20) and comprising at least one transistor (231b) forming a current mirror with a second current reference module (232b), each pull-up load (230a) and each pull-down load (230b) comprising a switch (233a, 233b), a closure that individually activates an associated one of the pull-up load (230a) and the pull-down load (230b), the input port (2) being configurable by ordering the closure or opening of each switch (233a, 233b),
    a first reference current source (30) coupled to the first current reference module (232a) of the at least one input port (2),
    a second reference current source (30) coupled to the second current reference module (232b) of the at least one input port (2),
    configuration means for the at least one input port.

2. The input circuit (3) claimed in claim 1, wherein the pull-up loads (230a) and the pull-down loads (230b) do not all comprise a same number of transistors (231a, 231b).

3. The input circuit (3) as claimed in claim 2, wherein the pull-up load (230a) of an index n, $1 \leq n \leq N$, N being a number of pull-up loads, comprises a number of transistors (231a) proportional to $2^{n-1}$, and a pull-down load (230b) of an index m, $1 \leq m \leq M$, M being a number of pull-down loads, comprises a number of transistors (231b) proportional to $2^{m-1}$.

4. The input circuit (3) as claimed in claim 3, wherein all the transistors (231a) of the N pull-up loads (230a) are coupled to the same first current reference module (232a), and all the transistors (231b) of the M pull-down loads (230b) are coupled to the same second current reference module (232b).

5. The input circuit (3) as claimed in claim 1, wherein the first reference current source (30) and the same reference current source (30) are one and the same reference current source, designed to power both the first current reference module (232a) and the second current reference module (232b).

6. The input circuit (3) of an electronic computer (4) of a motor vehicle according to claim 5, wherein the input circuit (3) is adapted to be coupled to at least one microcontroller (40).

7. The input circuit (3) as claimed in claim 5, comprising a plurality of input ports (2), wherein the same reference current source (30) is designed to supply a reference current to each input port (2).

8. The input circuit (3) of an electronic computer (4) of a motor vehicle according to claim 7, wherein the input circuit (3) is adapted to be coupled to at least one microcontroller (40) coupled to an input circuit conforming to claim 7.

9. The input circuit (3) as claimed in claim 7, comprising a reference voltage source (33) designed to supply the reference current source (30) with a reference voltage of adjustable value, according to which the intensity of the reference current is controlled.

10. The input circuit (3) of an electronic computer (4) of a motor vehicle according to claim 9, wherein the input circuit (3) is adapted to be coupled to at least one microcontroller (40).

11. The input circuit (3) of an electronic computer (4) according to claim 1, wherein the input circuit (3) is adapted to be coupled to at least one microcontroller (40).

12. The input circuit (3) of an of an electronic computer (4) as claimed in claim 11, the electronic computer (4) comprising a non-volatile electronic memory in which are stored instruction codes intended to be executed by the microcontroller (40) to configure or reconfigure the input ports (2) of the input circuit.

* * * * *